United States Patent [19]

Numata et al.

[11] 4,146,747
[45] Mar. 27, 1979

[54] FM STEREO DEMODULATING DEVICE

[75] Inventors: Tatsuo Numata; Susumu Yokoyama, both of Tokyo, Japan

[73] Assignee: Pioneer Electronic Corporation, Tokyo, Japan

[21] Appl. No.: 727,724

[22] Filed: Sep. 29, 1976
(Under 37 CFR 1.47)

[30] Foreign Application Priority Data

Oct. 1, 1975 [JP] Japan ................................ 50-119139

[51] Int. Cl.² ............................................. H04H 5/00
[52] U.S. Cl. ............................................. 179/15 BT
[58] Field of Search ................. 179/15 BT, 100.4 ST; 325/36; 329/50

[56] References Cited
U.S. PATENT DOCUMENTS

| 3,294,912 | 12/1966 | Merritt | 179/15 BT |
| 3,296,379 | 1/1967 | von Recklinghausen | 179/15 BT |
| 3,634,626 | 1/1972 | Staley | 179/15 BT |
| 3,825,697 | 7/1974 | Cornell et al. | 179/15 BT |
| 3,943,293 | 3/1976 | Bailey | 179/15 BT |
| 3,999,132 | 12/1976 | Smith | 179/15 BT |
| 4,029,906 | 6/1977 | Takahashi | 179/15 BT |

Primary Examiner—Douglas W. Olms
Attorney, Agent, or Firm—Sughrue, Rothwell, Mion, Zinn and Macpeak

[57] ABSTRACT

A sub-carrier switching signal is fed to a double balanced multiplier only when a pilot signal is detected, and the separation of the right and left channel outputs of the multiplier is performed only after the level of the pilot signal reaches a predetermined value.

3 Claims, 9 Drawing Figures

FM STEREO DEMODULATING DEVICE

BACKGROUND OF THE INVENTION

This invention relates to an FM stereo demodulator including circuit means for preventing audible clicking noises when the demodulator switches from a monaural to a stereo mode, and vice versa.

Conventional FM stereo demodulating circuits using a double balanced multiplier have a circuit construction such as that shown in FIG. 1, wherein a composite FM detector output is applied to an input terminal IN1. The FM detector output is also applied to a phase-locked-loop circuit 1 to derive a pilot signal and a sub-carrier to be used to perform the stereo mode demodulation in an in-phase relation to the FM detector output, i.e., the composite signal and the sub-carrier are applied to input terminals IN2 and IN4, respectively, of a double balanced multiplier 3. The pilot signal of 19KHz derived from the phase locked loop circuit 1 is used to obtain a 19KHz signal in-phase with the pilot signal contained in the composite signal by a phase detector 2. That is, the phase detector 2 provides an output of 19KHz whose level is in proportion to the level of the pilot signal contained in the composite signal. The output of the phase detector 2 is applied to one of the input terminals of an AND circuit 5, the other input IN3 being supplied with a stereo control signal to be described later. The AND circuit 5, which may have any conventional construction, provides an output when the output of the phase detector 2 is at or higher than a certain level and the stereo control signal is applied to the other input IN3.

FIG. 4c shows an inverted IF output versus an antenna input frequency. This may be used as the stereo control signal to be applied to the terminal IN3 of the AND circuit 5. In order to obtain a sharp edge, the waveform in FIG. 4c is appropriately shaped to obtain a waveform as shown in FIG. 4b.

The output of a composite signal detector (not shown) takes the form of an S shaped, substantial d.c. voltage or current superposed by high frequency components as shown in FIG. 4a. Since the S curve covers a range wider than $2\Delta f$, the width $2\Delta f$ of the control signal falls within the range $2\Delta f$. Therefore, the pilot signal can be detected prior to the stereo control signal.

The output of the phase detector 2, which is a signal of 19KHz in phase with the pilot signal contained in the composite signal, is first applied to the one input of the AND circuit 5 when the tuning frequency approaches the IF frequency $f_o$. When the tuning frequency reaches one edge of the stereo control signal in FIG. 4b, it is applied to the terminal IN3 of the AND circuit 5 to supply the signal of 19KHz to one input of a bias switch circuit 4 whose other input is connected to the output of the phase locked loop 1 to receive the subcarrier of 38 KHz.

FIG. 3a shows an example of the construction of the bias switch circuit 4. The output of the AND circuit 5 is applied to a base of a transistor Q through a diode D to bias the transistor to conduct. The signal of 38KHz from the phase locked loop 1 is also applied to the base, so that the latter is amplified. When the transistor Q conducts, a relay coil L is actuated to close a lamp circuit PL to indicate the stereo mode.

The output of the bias switch circuit 4 is applied to an input terminal IN4 of the double balanced multiplier 3.

FIG. 3b shows a typical circuit construction of the double balanced multiplier 3. In FIG. 3b, a first pair of common emitter transistors Q1 and Q2 and a second pair of common emitter transistors Q3 and Q4 form switching circuits. Each of the switching circuits performs a switching operation in response to the application of the subcarrier signal to input IN4. Transistors Q5 and Q6 form a differential amplifier. Transistors Q3, Q4 and Q6 further form a crosstalk and subcarrier cancelling circuit. The base input IN2 of transistor Q5 is supplied with the composite signal, and the base of transistor Q6 is supplied with a fixed biasing voltage. From a collector terminal OUT1, to which the collectors of transistors Q2 and Q4 are connected, a right channel output is derived through a load resistor R2, and from a collector terminal OUT2, to which the collectors of transistors Q1 and Q3 are connected, a left channel output is derived through a load resistor R1.

In the conventional circuit construction described above, when the tuning frequency approaches a stereophonic broadcast, the double balanced multiplier 3 is switched from the monaural mode to the stereo mode at the time when the tuning frequency reaches the edge of the range $2\Delta f$ in FIG. 4b. At that time a distinct clicking noise is often produced in the output terminals OUT1 and OUT2 of the double balanced multiplier 3 due to characteristic unbalances of the circuit elements, such as transistors, etc., constituting the multiplier.

That is, when the circuit of FIG. 3b is operating in the monaural mode a positive in-phase biasing voltage is supplied across terminal IN4, so that the transistors Q1-Q4 are in an on state to provide the same outputs at terminals OUT1 and OUT2. Representing the collector currents of transistors Q5 and Q6 as $I_1$ and $I_2$, respectively, the collector currents of transistors Q1-Q4 as $kI_1$, $(1-k)I_1$, $k'I_2$ and $(1-k')I_2$, respectively, and the currents of the load resistors R1 and R2 as $I_L$ and $I_R$, respectively, then the load currents $I_L$ and $I_R$ may be defined as follows for the monaural mode:

$$I_L = kI_1 + k'I_2 \qquad (1)$$

$$I_R = (1-k)I_1 + (1-k')I_2 \qquad (2)$$

In the stereo mode, on the other hand, the average load currents are as follows:

$$I_L = \tfrac{1}{2}(I_1 + I_2) \qquad (3)$$

$$I_R = \tfrac{1}{2}(I_1 + I_2) \qquad (4)$$

If there is any difference between equations (1) and (3) and between equations (2) and (4), then a clicking noise will be produced when the operation mode is switched between monaural and stereo, i.e., at the transient time of switching.

Assuming that:

$$|\text{equation (3)} - \text{equation (1)}| = I_{PL}, \text{ and} \qquad (5)$$

$$|\text{equation (4)} - \text{equation (2)}| = I_{PR}, \qquad (6)$$

then it follows that, by substitution:

$$I_{PL} = |\tfrac{1}{2}(I_1+I_2)-(kI_1+k'I_2)| = \\ |\tfrac{1}{2}\{(1-2k)I_1+(1-2k')I_2\}| \qquad (7)$$

$$I_{PR} = |\tfrac{1}{2}(I_1+I_2)-\{(1-k)I_1+(1-k')I_2\}| = \\ |\tfrac{1}{2}\{(2k1)I_1+(2k'-1)I_2\}| \qquad (8)$$

In equations (7) and (8), if the collector current of transistor Q1 is equal to that of transistor Q2, and if the collector current of transistor Q3 is equal to that of transistor Q4, then the constants k and k' are both equal to 0.5 and $I_{PL}=I_{PR}=0$. In this case, there is no possibility of any clicking noise in the terminals OUT1 and OUT2 even when the mode is suddenly switched from monaural to stereo. However, as a practical matter the constants k and k' may not always equal 0.5 due to characteristic unbalances of the paired circuit elements in the multiplier 3. As a result, $I_{PL}$ and $I_{PR}$ may not be zero in the monoaural mode. Since in the stereo mode $I_{PL}$ and $I_{PR}$ are always necessarily equal to each other, any difference between $I_{PL}$ and $I_{PR}$ in the monaural mode must be reduced immediately upon switching. The clicking noise is produced as a result of such transient changes of $I_{PL}$ and $I_{PR}$.

SUMMARY OF THE INVENTION

The present invention relates to an FM stereo demodulating circuit which employs a double balanced multiplier together with means for automatically switching the operational mode of the multiplier between monaural and stereo in such a manner that the clicking noise which may occur when switching from the monaural mode to the stereo mode, or vice versa, is prevented.

An object of the present invention is therefore to provide an improved FM stereo demodulating circuit which exhibits no disadvantageous clicking noise inherent in conventional circuits.

This object is achieved by controlling the subcarrier signal to be applied to the double balanced multiplier in response to the level of the pilot signal contained in the composite signal, to thereby separate the output channels of the multiplier after the latter is switched from the monaural to the stereo mode only after the pilot signal has reached a predetermined magnitude.

DETAILED DESCRIPTION OF THE PREFERRED EMBODIMENT

Figure 1:
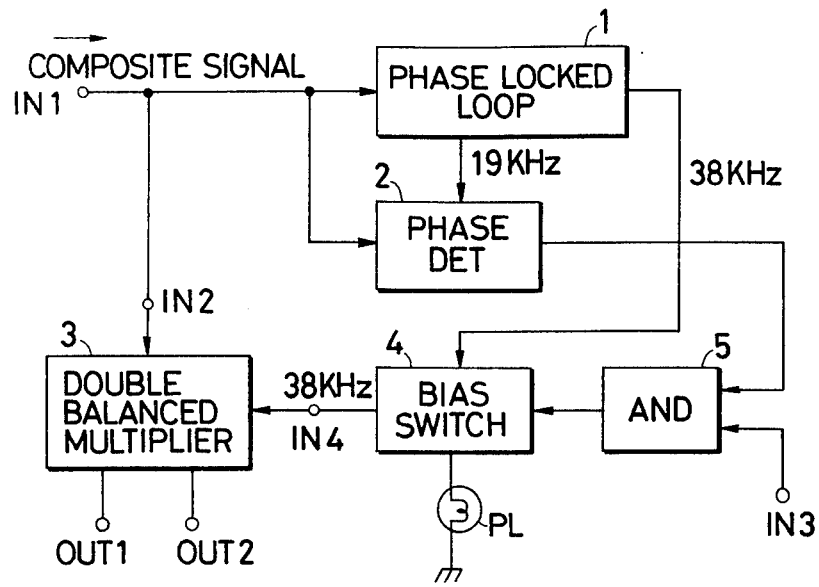
FIG. 1 is a block diagram of a conventional FM stereo demodulator.
Figure 2:
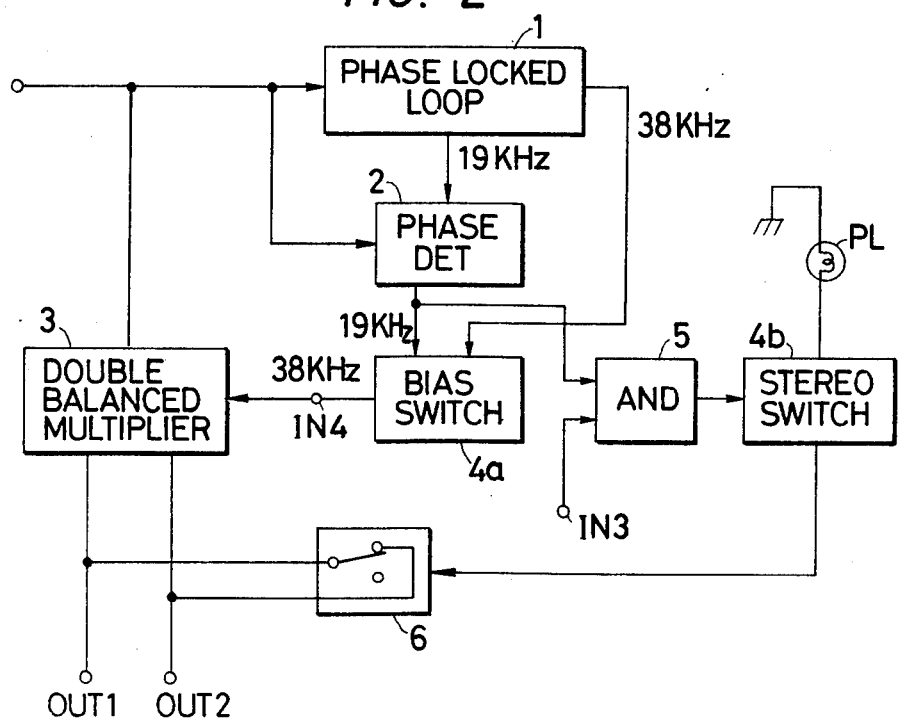
FIG. 2 is a block diagram of an embodiment of the present invention.

In FIG. 2, reference numerals corresponding to those used in FIG. 1 represent the same components, or components having the same functions.

A sub-carrier of 38KHz, derived in the same manner as in FIG. 1, is applied to a bias switch circuit 4a.

The bias switch circuit 4a controls the operational mode of the multiplier 3 between stereo and monaural, according to whether a pilot signal is available from the phase detector 2. That is, when a pilot signal is present the switch 4a feeds the sub-carrier of 38KHz to the input terminal IN4 of the multiplier 3, to thereby switch the bias from a d.c. signal for the monoaural mode to the sub-carrier signal for the stereo mode. When the pilot signal from the phase detector 2 is terminated, the positive d.c. voltage is again applied to the multiplier.

Figure 4:
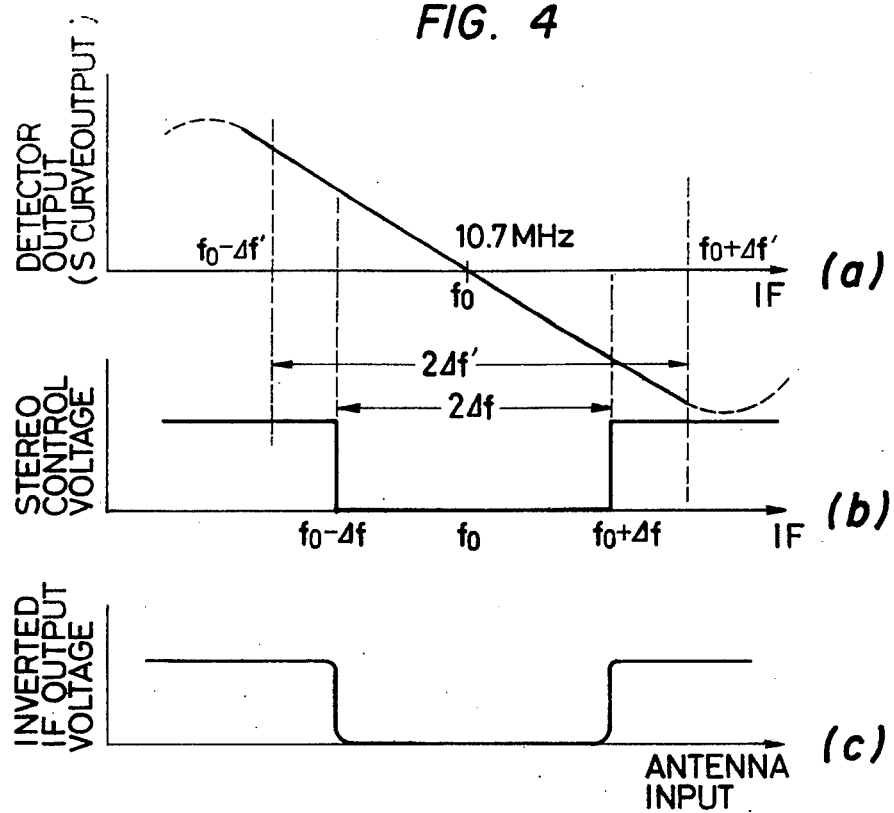
FIGS. 4a to 4c are waveforms of the IF output and the stereo control signal for explanatory purposes.

Thus, as the tuning frequency comes within the range of the IF output curve S in FIG. 4a, the phase detector 2 detects the pilot signal and supplies it to the bias switch circuit 4a. When the magnitude of the pilot signal reaches a certain level during further tuning, the circuit 4a passes the 38KHz signal from the phase locked loop 1 to the bias input IN4 of the double balanced multiplier 3 to switch the bias from a d.c. signal to the 38KHz signal. Therefore, the multiplier 3 is ready for stereo mode operation. However, since the outputs OUT1 and OUT2 are still short-circuited by the closed switch 6, the output of the system remains in a monaural mode.

Figure 5:
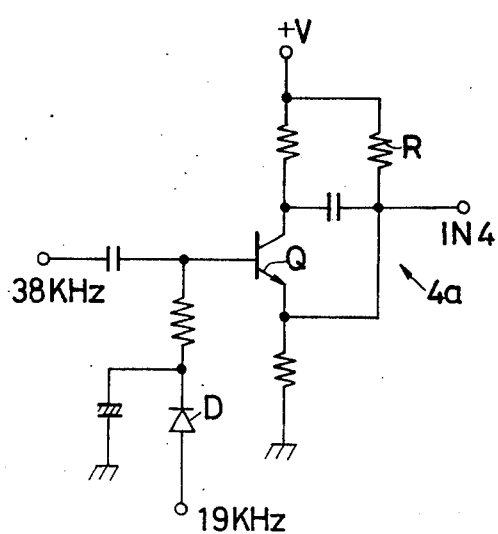
FIG. 5 is a schematic circuit diagram of the bias switching circuit shown by the block 4a in FIG. 2.

Describing this in more detail, FIG. 5 shows an example of a bias switch circuit 4a, wherein the pilot signal from the detector 2 is applied to a diode D. When there is no pilot signal, or when the magnitude thereof is below a predetermined level, the transistor Q is in the off state, and therefore a d.c. current flows through a relatively large resistor R to provide a d.c. bias voltage to the terminal IN4.

Figure 3A:
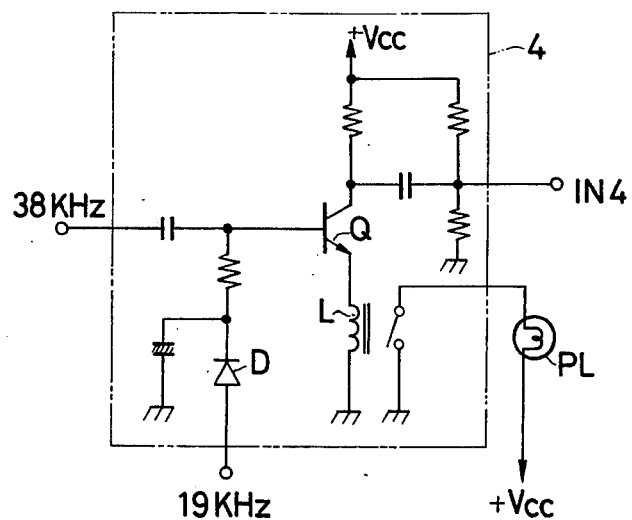
FIG. 3a is a schematic circuit diagram of a bias switch circuit as shown by the block 4 in FIG. 1.
Figure 3B:
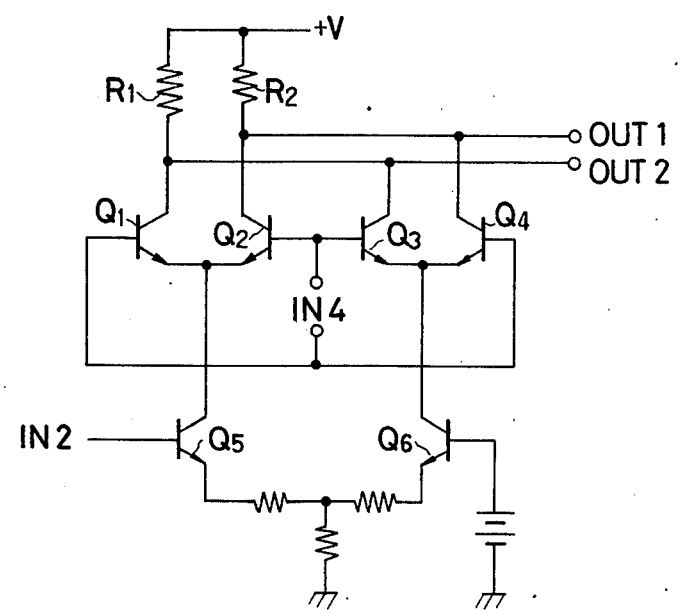
FIG. 3b is a schematic circuit diagram of the double balanced multiplier shown by the block 3 in FIG. 1.

When the pilot signal reaches a sufficient amplitude the bias therefrom applied to the base of the transistor Q renders the latter conductive. Since the value of resistor R is relatively large, the d.c. current flowing through it is negligible. Therefore, the sub-carrier supplied from the phase locked loop 1 is amplified and fed to terminal IN4 of the multiplier 3 in FIG. 3b to cause the bias of the latter to be switched from a d.c. signal to the sub-carrier, to thereby place the multiplier in a stereo mode. The threshold functioning of the bias switch circuit 4a, whereby it only passes the sub-carrier when the pilot signal reaches a predetermined level, may be implemented by the selection of a transistor Q having appropriate switching characteristics and by the corresponding selection of an appropriate emitter resistor.

An AND circuit 5, which functions in substantially the same manner as that in FIG. 1, controls the operation of a stereo switch circuit 4b. One input of the AND circuit is supplied with the pilot signal from the phase detector 2. When the amplitude of the pilot signal increases beyond a predetermined level the AND circuit 5 becomes enabled. The level at which the AND circuit is enabled is selected to be higher than the level at which the bias switch circuit 4a begins to supply the sub-carrier to the terminal IN4 of the multiplier 3. The threshold functioning of the AND circuit 5, whereby it only produces an output when the pilot signal reaches a predetermined amplitude level higher than that required for the functioning of the bias switch circuit 4a, may be implemented in any number of ways well known in the art, as, for example, by the selection of circuit components having desired parameters in relation to the circuit design. Under these conditions, when the stereo control signal is applied to the other input IN3 of the AND circuit 5 an output is provided thereby.

Figure 6:
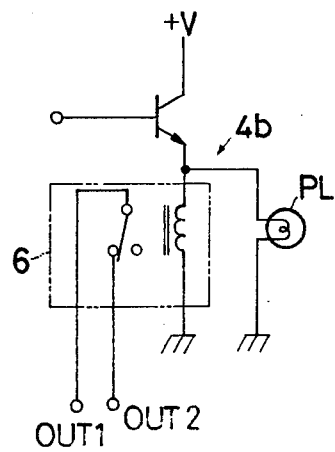
FIG. 6 is a schematic circuit diagram of the stereo switching circuit shown by the blocks 4b and 6 in FIG. 2.

FIG. 6 shows a schematic diagram of the stereo switch circuit 4b together with the normally closed switch device 6. The output of the AND circuit 5 is applied to a base of a transistor to bias the latter into conduction. This causes a d.c. current to flow through a relay coil and a lamp circuit connected in parallel with the coil. Thus, the stereo indicating lamp PL is illuminated and the relay coil is energized, which causes the normally closed contacts of the switch 6 to open. The output terminals OUT1 and OUT2 of the double balanced multiplier 3 are therefore disconnected from each other to provide separate right and left channel stereo outputs.

The load currents $I_L$ and $I_R$ in the stereo mode of operation are expressed by equations (3) and (4). Since during monaural operation with sub-carrier biasing, which occurs after normal monaural operation but before normal stereo operation, the switch 6 is closed to short-circuit the terminals OUT1 and OUT2, the load currents during this time interval are also expressed by equations (3) and (4). Therefore, no clicking noise is produced when the system is finally switched into the normal stereo mode, i.e. when the relay controlled switch 6 is opened.

Summarizing, according to the present invention a double balanced multiplier is made operative in the stereo mode in response to the reception of a pilot signal of a predetermined level, while the outputs thereof remain short-circuited. The multiplier outputs are subsequently separated from each other or open-circuit in response to an increase of the pilot signal beyond said predetermined level. Thus, any clicking noises due to the characteristic unbalances of the transistors, etc., constituting the double balanced multiplier are prevented because the right and left channel load currents of the multiplier are allowed to equalize prior to the final switching to the stereo mode of operation.

What is claimed is:
1. An FM demodulating circuit comprising:

(a) a double balanced multiplier having a composite signal input, a bias signal input, a right channel output and a left channel output, and channel outputs being normally connected together;
 (b) a phase locked loop responsive to a composite signal for producing a pilot signal and a sub-carrier;
 (c) a phase detector responsive to a pilot signal from said phase locked loop and a composite signal for providing an in-phase pilot signal;
 (d) first means responsive to an in-phase pilot signal of a predetermined level for causing said multiplier to be operative in a stereo mode; and
 (e) second means responsive to an in-phase pilot signal higher than said predetermined level for separating said multiplier channel outputs from each other, whereby said demodulating circuit becomes operative in a stereo mode.

2. The FM demodulating circuit set forth in claim 1, wherein said first means includes a bias switch circuit for supplying a d.c. bias voltage to said multiplier when the in-phase pilot signal level is lower than said predetermined level, and the sub-carrier when the in-phase pilot signal level is equal to or higher than said predetermined level.

3. The FM demodulating circuit set forth in claim 2, wherein said second means includes an AND circuit having one input supplied with the in-phase pilot signal and another input supplied with a stereo control signal, and a normally closed channel switch connected between said channel outputs of said multiplier, said switch being responsive to the output of said AND circuit for disconnecting said channel outputs from each other.

* * * * *